(12) United States Patent
Chuang et al.

(10) Patent No.: US 9,721,947 B2
(45) Date of Patent: Aug. 1, 2017

(54) SEMICONDUCTOR DEVICE AND METHOD OF MANUFACTURING

(71) Applicant: TAIWAN SEMICONDUCTOR MANUFACTURING COMPANY, LTD., Hsinchu (TW)

(72) Inventors: Harry Hak-Lay Chuang, Singapore (SG); Wei Cheng Wu, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/178,429

(22) Filed: Feb. 12, 2014

(65) Prior Publication Data

US 2015/0228645 A1    Aug. 13, 2015

(51) Int. Cl.
| | |
|---|---|
| *H01L 27/088* | (2006.01) |
| *H01L 21/8234* | (2006.01) |
| *H01L 29/78* | (2006.01) |
| *H01L 29/161* | (2006.01) |
| *H01L 29/16* | (2006.01) |
| *H01L 21/265* | (2006.01) |
| *H01L 21/266* | (2006.01) |
| *H01L 29/66* | (2006.01) |
| *H01L 21/02* | (2006.01) |

(Continued)

(52) U.S. Cl.
CPC ...... *H01L 27/088* (2013.01); *H01L 21/02529* (2013.01); *H01L 21/02532* (2013.01); *H01L 21/266* (2013.01); *H01L 21/2652* (2013.01); *H01L 21/26513* (2013.01); *H01L 21/823412* (2013.01); *H01L 21/823418* (2013.01); *H01L 21/823462* (2013.01); *H01L 29/161* (2013.01); *H01L 29/165* (2013.01); *H01L 29/1608* (2013.01); *H01L 29/66636* (2013.01); *H01L 29/7848* (2013.01); *H01L 29/51* (2013.01); *H01L 29/78* (2013.01)

(58) Field of Classification Search
CPC ........... H01L 27/088; H01L 21/823418; H01L 29/7848; H01L 29/161; H01L 29/1608; H01L 21/2652; H01L 21/266; H01L 29/66636; H01L 21/02529; H01L 21/02532; H01L 21/26513; H01L 21/823412; H01L 29/165; H01L 29/06
See application file for complete search history.

(56) References Cited

U.S. PATENT DOCUMENTS

| | | | | |
|---|---|---|---|---|
| 3,867,204 | A * | 2/1975 | Rutledge | ............. H01L 21/8236 148/DIG. 151 |
| 2006/0125028 | A1* | 6/2006 | Chen | ................... H01L 29/7833 257/410 |

(Continued)

*Primary Examiner* — Moazzam Hossain
*Assistant Examiner* — Farun Lu
(74) *Attorney, Agent, or Firm* — Hauptman Ham, LLP

(57) ABSTRACT

A semiconductor device includes a semiconductor substrate, and first and second transistors over the semiconductor substrate. Both the first and second transistors are p-type transistors or both the first and second transistors are n-type transistors. The first and second transistors have the same nominal operating voltage. The first transistor has a higher threshold voltage than the second transistor. The second transistor has at least one of a source region or a drain region with higher charge carrier mobility than at least one of a source region or a drain region of the first transistor.

20 Claims, 8 Drawing Sheets

(51) Int. Cl.
*H01L 29/51* (2006.01)
*H01L 29/165* (2006.01)

(56) References Cited

U.S. PATENT DOCUMENTS

| | | | | |
|---|---|---|---|---|
| 2011/0057267 A1* | 3/2011 | Chuang | ........... | H01L 21/823842 |
| | | | | 257/380 |
| 2012/0056268 A1* | 3/2012 | Mizutani | ......... | H01L 21/823857 |
| | | | | 257/369 |
| 2013/0099319 A1* | 4/2013 | Adam | ................... | H01L 27/092 |
| | | | | 257/351 |
| 2013/0328133 A1* | 12/2013 | Song | ............... | H01L 21/823412 |
| | | | | 257/392 |
| 2013/0341722 A1* | 12/2013 | Illgen | ..................... | H01L 21/84 |
| | | | | 257/351 |
| 2014/0231914 A1* | 8/2014 | Chang | ............... | H01L 29/66795 |
| | | | | 257/347 |

* cited by examiner

SEMICONDUCTOR DEVICE AND METHOD OF MANUFACTURING

BACKGROUND

The recent trend in miniaturizing integrated circuits (ICs) has resulted in smaller devices which consume less power, yet provide more functionally at higher speeds than before. For these advantages to be realized, various developments in IC manufacturing are developed. For example, as semiconductor devices, such as metal-oxide-semiconductor field-effect transistors (MOSFETs), are scaled down, source and drain regions of MOSFETs are formed with stressors to enhance carrier mobility and improve device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
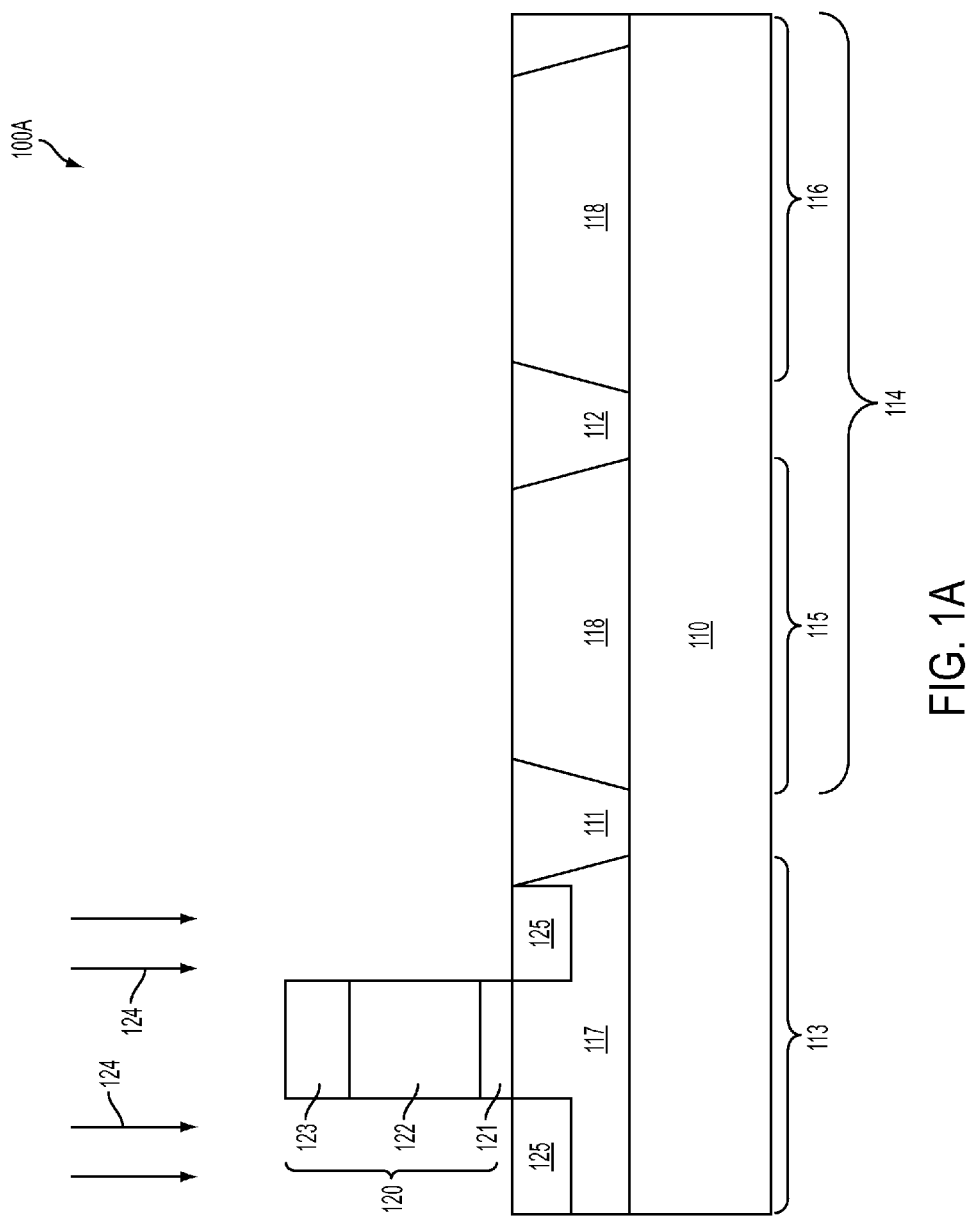
FIGS. 1A-1F are schematic cross-sectional views of a semiconductor device in various manufacturing operations in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, stressors are formed in devices or transistors with lower threshold voltages, but are not formed in devices or transistors with higher threshold voltages. As a result, enhanced carrier mobility and device performance are obtainable for the devices or transistors with lower threshold voltages. In the devices or transistors with higher threshold voltages, leakage current, which is associated with carrier mobility, is reduced due to the absence of stressors. The reduced leakage current in devices or transistors with higher threshold voltages is preferred over enhanced carrier mobility in at least one embodiment.

FIGS. 1A-1F are schematic cross-sectional views of a semiconductor device in various manufacturing operations in accordance with some embodiments.

In one or more embodiments, the semiconductor device comprises active components such as field effect transistors (FET), complementary metal-oxide-semiconductor (CMOS) transistors, metal-oxide-semiconductor field effect transistors (MOSFETs), high voltage transistors, high frequency transistors, and combinations thereof. In one or more embodiments, the semiconductor device comprises passive components, such as resistors, capacitors, inductors, and fuses. In the description below, p-channel metal-oxide semiconductor (PMOS) and/or n-channel metal-oxide semiconductor (NMOS) devices are described. However, further embodiments are applicable to other types of semiconductor devices or components.

In the operation in FIG. 1A, a substrate 110 is formed with a plurality of isolation features 111, 112. In some embodiments, the substrate 110 comprises an elementary semiconductor, a compound semiconductor, an alloy semiconductor, or combinations thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, the substrate 110 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type.

The isolation features 111, 112 are formed at least partially in the substrate 110. In some embodiments, the isolation features 111, 112 include raised structures partially located outside the substrate 110. The isolation features 111, 112 utilize isolation technology, such as local oxidation of silicon (LOCOS) and/or shallow trench isolation (STI), to define and electrically isolate various regions of the substrate 110 from each other. In some embodiments, the isolation features 111, 112 comprise silicon oxide, silicon nitride, silicon oxynitride, other suitable materials, or combinations thereof. The isolation features 111, 112 are formed by a suitable process. In one example, the formation of an STI comprises a photolithography process, etching a trench in the substrate 110, and filling the trench, for example, by using a chemical vapor deposition (CVD) process with one or more dielectric materials. In one or more embodiments, the filled trench has a multi-layer structure, such as a thermal oxide liner layer filled with silicon nitride or silicon oxide.

The isolation features 111, 112 isolate various regions of the substrate 110 from each other. For example, one or more isolation features 111 (one of which is indicated in FIG. 1A for simplicity) isolate an input/output (I/O) device region 113 of the substrate 110 from a core device region 114 of the substrate 110. The core device region 114 includes circuitry formed of core devices which are the devices having the thinnest gate dielectric layer, fastest speed and lowest nominal operating voltage in the semiconductor device. The I/O device region 113 includes I/O devices which are configured to input and output data to and from the circuitry in the core device region 114, and to exchange data with a peripheral device either in the semiconductor device or external to the semiconductor device. In at least one embodiment, the peripheral device includes at least one embedded flash cell formed over the substrate 110. The I/O devices have a higher nominal operating voltage than the core devices.

One or more isolation features 112 (one of which is indicated in FIG. 1A for simplicity) are formed inside the core device region 114, and isolate a region 115 for at least one core device with a higher threshold voltage (hereinafter "HVt device") from a region 116 for at least one core device with a lower threshold voltage (hereinafter "LVt device"). The HVt and LVt devices are both core devices and have the same nominal operating voltage. However, the HVt and LVt devices are configured to have different threshold voltages depending on the circuit design and/or application. In at least one embodiment, the HVt devices comprise devices with different levels of threshold voltages which are referred to as high threshold voltage devices and ultra-high threshold voltage devices in some situations. In at least one embodiment, the LVt devices comprise devices with different levels of threshold voltages which are referred to as standard threshold voltage devices, low threshold voltage devices and ultra-low threshold voltage devices in some situations.

One or more isolation features (not indicated in FIG. 1A) further isolate regions for p-type devices from regions for n-type devices. A p-type device is a device configured to have holes as charge carriers. An example of a p-type device is a PMOS transistor. An n-type device is a device configured to have electrons as charge carriers. An example of an n-type device is an NMOS transistor. In the following description, all regions 113, 115, and 116 indicated in FIG. 1A are for the same type of devices. In one example, all devices in the regions 113, 115, and 116 are PMOS devices. In another example, all devices in the regions 113, 115, and 116 are NMOS devices.

The isolation features 111, 112 define active regions 117, 118 in the corresponding I/O device region 113 and core device region 114. In some embodiments, one or more of the active regions 117, 118 include doped regions. A p-type doped region comprises one or more p-type dopants, such as boron or $BF_2$. An n-type doped region comprises one or more n-type dopants, such as phosphorus or arsenic. In one or more embodiments, doped regions are formed directly on the substrate 110, in a P-well structure, an N-well structure, a dual-well structure, or a raised structure. When a p-type doped region is being formed, n-type doped regions or regions to be doped with n-type dopants are protected, for example, by one or more protective layers, such as photoresist layers, and vice versa. In at least one embodiment, the active region 117 of an I/O device is configured to be different from the active regions 118 of the HVt and LVt devices, for example, by performing different doping operations in the active region 117 and in the active regions 118. In at least one embodiment, the active regions 118 of the HVt and LVt devices are configured to be the same.

A gate structure 120 of an I/O device is formed over the substrate 110 in the I/O device region 113. The gate structure 120 comprises a gate dielectric layer 121, a gate electrode 122, and a hard mask layer 123. Other layers are included in some embodiments. In some embodiments, the gate structure 120 is formed by CVD, physical vapor deposition (PVD), atomic layer deposition (ALD), high density plasma CVD (HDPCVD), plating, other suitable methods, or combinations thereof.

The gate dielectric layer 121 is formed over the substrate 110 and comprises a dielectric material, a high-k dielectric material, other suitable dielectric material, or combinations thereof. Examples of a dielectric material include, but are not limited to, silicon oxide, silicon oxynitride, silicon nitride, or combinations thereof. Examples of high-k dielectric materials include, but are not limited to, $HfO_2$, HfSiO, HfSiON, HfTaO, HfTiO, HfZrO, or combinations thereof. In some embodiments, the gate dielectric layer 121 comprises a multilayer structure. For example, the gate dielectric layer 121 comprises an interfacial layer, and a high-k dielectric material layer formed on the interfacial layer. An exemplary interfacial layer is a grown silicon oxide layer formed by a thermal process or ALD process.

The gate electrode 122 is formed over the gate dielectric layer 121. In one or more embodiments, the gate electrode 122 is a polycrystalline silicon (polysilicon) layer. In one or more embodiments, the polysilicon layer is doped for proper conductivity, e.g., in a gate-first process. In one or more embodiments, the polysilicon is not doped where it is a dummy gate to be replaced in a subsequent gate replacement (gate last) process. In one or more embodiments, the gate electrode 122 comprises a conductive layer having a proper work function. For example, a p-type work function metal (p-metal) comprises TiN, TaN and/or a carbon-doped metal nitride such as TaCN, whereas an n-type work function metal (n-metal) comprises Ta, TiAl, and/or TiAlN—. In one or more embodiments, the work function layer comprises doped conducting oxide materials. In one or more embodiments, the gate electrode 122 comprises other conductive materials, such as aluminum, copper, tungsten, metal alloys, metal silicide, other suitable materials, or combinations thereof. For example, where the gate electrode 122 comprises a work function layer, another conductive layer is formed over the work function layer.

The hard mask layer 123 is formed over the gate electrode 122 to function as an etch mask, and/or to protect the underlying layers from damage during subsequent processing. In one or more embodiments, the hard mask layer 123 comprises silicon oxide, silicon nitride, silicon oxynitride, silicon carbide, or combinations thereof. The described structure of the gate structure 120 is an example. Other gate structure configurations are within the scope of various embodiments.

The regions of the I/O device region 113 outside the gate structure 120 are doped with dopants 124 to form lightly doped source/drain (LDD) regions 125. The dopants are selected depending on the type of the devices to be formed in the LDD regions 125. For example, LDD regions for forming NMOS devices are doped with an n-type dopant, such as phosphorous or arsenic, and LDD regions for forming PMOS devices are doped with a p-type dopant, such as boron or $BF_2$. A resulting structure 100A is obtained upon formation of the LDD regions 125.

Figure 1B:
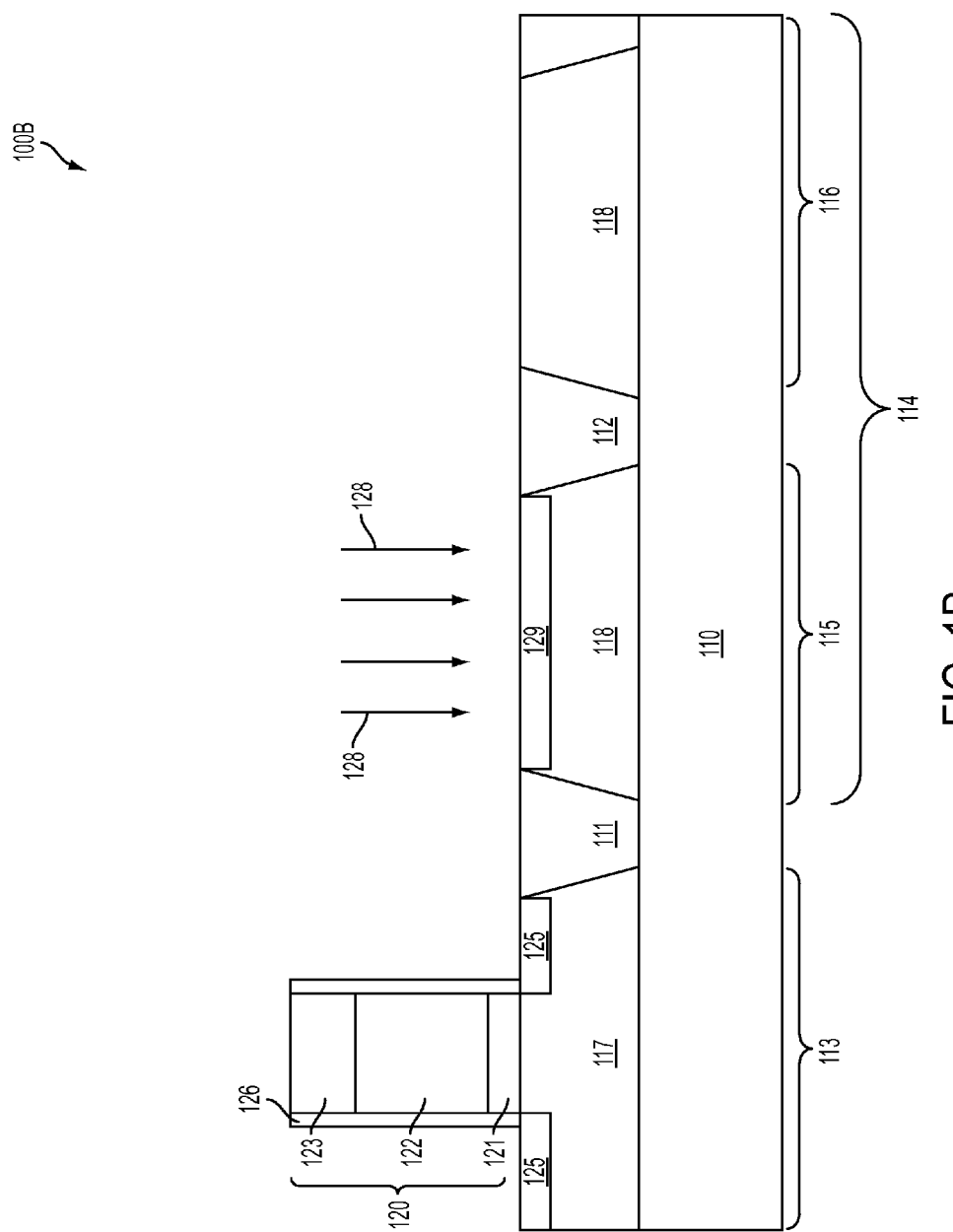

In the operation in FIG. 1B, dummy spacers 126 are formed over sidewalls of the gate structure 120. In at least one embodiment, the dummy spacers 126 comprise a nitride material, such as silicon nitride, silicon oxide, silicon oxynitride, or combinations thereof. In some embodiments, a liner is formed over the sidewalls of the gate structure 120 before the spacers 126 are formed. In at least one embodiment, such a liner comprises an oxide material, such as silicon oxide and/or another suitable dielectric material. In at least one embodiment, the liner and the dummy spacers 126 are formed by blanket depositing a first dielectric layer for defining the liner over the structure 100A, and a second dielectric layer for defining the dummy spacers 126 over the first dielectric layer. The dielectric layers are then anisotropically etched to form the liner and the dummy spacers 126.

A selective ion implantation is performed to adjust the threshold voltage of the HVt device in the HVt device region 115 to be higher than the threshold voltage of the LVt device in the LVt device region 116. For example, when the HVt device to be formed is a PMOS transistor, n-type dopants 128, such as phosphorous, are implanted into the active region 118 of the HVt device in the HVt device region 115, to form the n-doped region 129. The presence of n-type dopants 128 in the active region 118 of a PMOS transistor decreases the number of holes (which are charge carriers of the PMOS transistor) available in a channel region of the PMOS transistor. Since fewer holes are available, a higher gate voltage is to be applied for switching the PMOS transistor, i.e., the threshold voltage of the PMOS transistor is increased. When the HVt device to be formed is an NMOS transistor, p-type dopants, such as boron, are implanted into the active region 118 of the HVt device. The higher the concentration of the dopants 128, the higher the threshold voltage of the HVt device. In some embodiments, the dopants 128 are implanted in the active region 118 of the HVt device, and are not implanted in the active region 118 of the LVt device. In some embodiments, the dopants 128 are implanted in the active regions 118 of both the HVt and LVt devices, and with a higher concentration of the dopants 128 in the active region 118 of the HVt device than in the active region 118 of the LVt device. The described threshold voltage adjustment through ion implantation is an example. Other threshold voltage adjustment arrangements are within the scope of various embodiments. A resulting structure 100B is obtained upon completion of the threshold voltage adjustment.

Figure 1C:
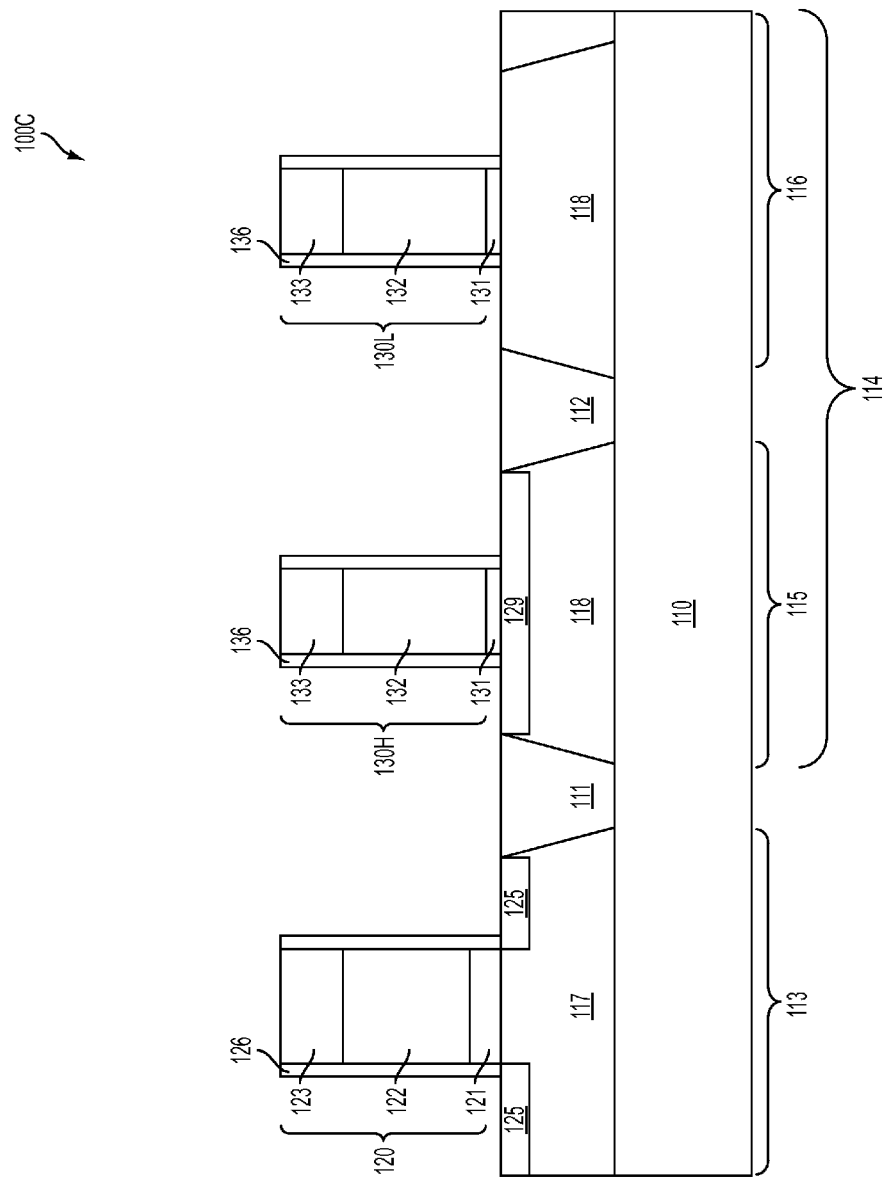

In the operation in FIG. 1C, gate structures 130H and 130L are formed over the structure 100B, in the active regions 118 of the HVt and LVt devices. In at least one embodiment, the gate structure 130H has a narrower width (or gate length) than the gate structure 120, resulting in a HVt device (which is a core device) having a smaller size than the I/O device corresponding to the gate structure 120. Similarly, the gate structure 130L has a narrower width (or gate length) than the gate structure 120, resulting in a LVt device (which is a core device) having a smaller size than the I/O device corresponding to the gate structure 120.

In at least one embodiment, the gate structures 130H and 130L are configured to have the same configuration comprising a gate dielectric layer 131, a gate electrode 132 and a hard mask layer 133. In some embodiments, one or more of the described materials of and/or processes for forming the gate dielectric layer 121, gate electrode 122 and hard mask layer 123 are applicable to the corresponding gate dielectric layer 131, gate electrode 132 and hard mask layer 133. In at least one embodiment, the gate dielectric layers 131 of the gate structures 130H and 130L have the same dielectric material of the same thickness which is thinner than the gate dielectric layer 121 of the I/O device, resulting in the corresponding core devices having a faster speed and/or a lower nominal operating voltage than the I/O device.

In some embodiments, the regions of the core device region 114 outside the gate structures 130H and 130L are doped to form LDD regions (not indicated in the figures). One or more of the described materials of and/or processes for forming the LDD regions 125 in the I/O device region 113 are applicable to the LDD regions in the core device region 114.

Dummy spacers 136 are formed over sidewalls of the gate structures 130H and 130L. In some embodiments, the spacers 136 are formed after the formation of the LDD regions in the core device region 114. In at least one embodiment, one or more of the described materials of and/or processes for forming the spacers 126 are applicable to the spacers 136. A resulting structure 100C is obtained upon formation of the gate structures 130H and 130L and the spacers 126.

Figure 1D:
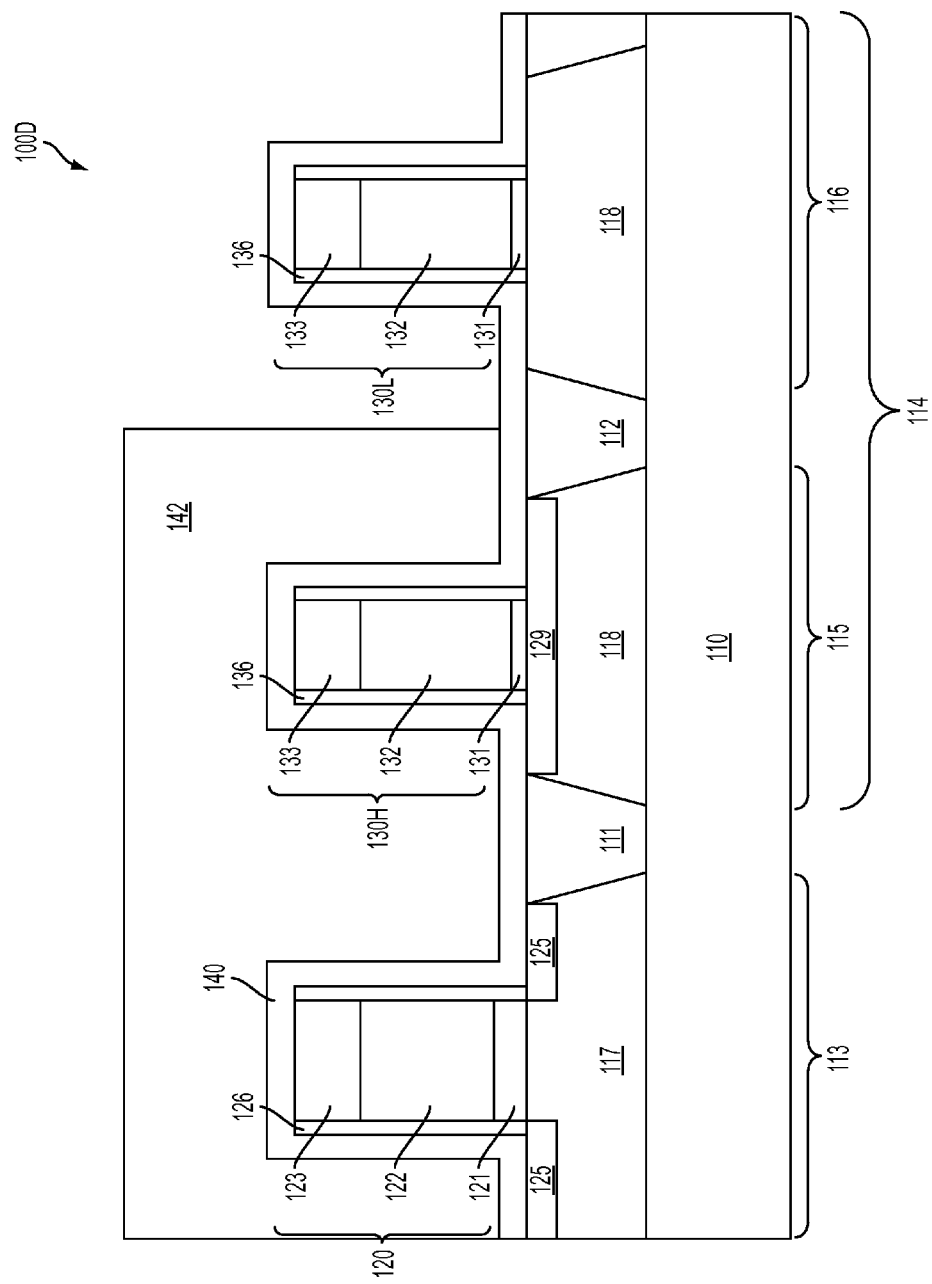

In the operation in FIG. 1D, a sacrificial layer 140 is formed over the structure 100C, and covers the I/O device region 113 and the core device region 114 including the gate structures 120, 130H, 130L formed thereover. In some embodiments, the sacrificial layer 140 includes SiN. Other materials are within the scope of various embodiments. A photoresist layer 142 is formed over the sacrificial layer 140. The photoresist layer 142 covers the I/O device region 113 and the HVt device region 115, without covering the LVt device region 116. In at least one embodiment, at least one embedded flash cell is formed over the substrate 110, and the sacrificial layer 140 and photoresist layer 142 cover the embedded flash cell. A resulting structure 100D is obtained upon formation of the sacrificial layer 140 and the photoresist layer 142.

Figure 1E:
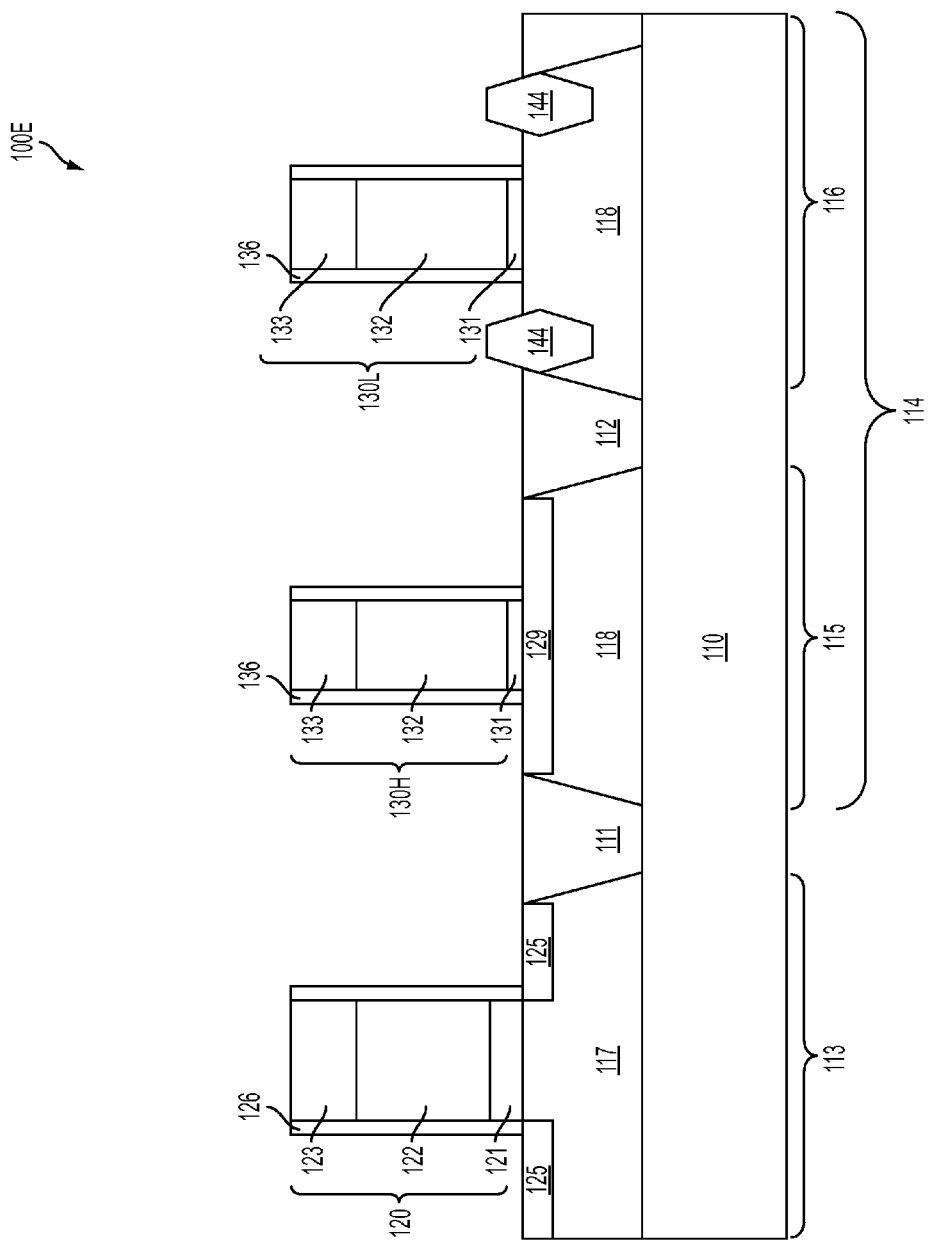

In the operation in FIG. 1E, a stressor is formed in at least one of a source region or a drain region of the LVt device in the LVt device region 116 which is not covered by the photoresist layer 142. The stressor is configured to enhance charge carrier mobility in the at least one source or drain region. For example, for a PMOS device, the stressor is configured to apply a compressive stress to enhance hole mobility in the at least one source or drain region of the PMOS device. For an NMOS device, the stressor is configured to apply a tensile stress to enhance electron mobility in the at least one source or drain region of the PMOS device. Examples of the stressor material include, but are not limited to, SiGe, SiC, GeSn, SiGeSn, and other suitable materials. In at least one embodiment, the stressor for a PMOS device comprises SiGe. In at least one embodiment, the stressor for an NMOS device comprises SiC.

In at least one embodiment, the stressor formation comprises an etching process and a deposition process. The etching process is performed to remove portions of the sacrificial layer 140 and the substrate 110 outside the gate structure 130L and the isolation feature 112 to form recesses in the substrate 110, corresponding source and drain regions of the LVt device. In some embodiments, the recesses are formed in the LDD regions 125 previously formed in the LVt device region 116. The etching process comprises a dry etching process, a wet etching process, or combinations thereof.

In the deposition process, a semiconductor material is deposited in the recesses to form stressors 144 in the source and drain regions of the LVt device. In one or more embodiments, an epitaxial process (epitaxy) is performed to deposit the semiconductor material in the recesses. Examples of the epitaxial process include, but are not limited to, a selective epitaxy growth (SEG) process, CVD deposition techniques (e.g., vapor-phase epitaxy (VPE) and/or ultra-high vacuum CVD (UHV-CVD)), molecular beam epitaxy, other suitable epitaxial processes, or combinations thereof. In one or more embodiments, the epitaxial process uses gaseous and/or liquid precursors, which interact with the composition of the substrate 110.

The grown stressors 144 are raised above an upper surface of the substrate 110 and are higher than corresponding source and drain regions of the HVt device in the HVt device region 115. In some embodiments, the stressors 144 are grown to have an upper surface flush with or lower than the upper surface of the substrate 110. A resulting structure 100E is obtained upon removal of the sacrificial layer 140 and the photoresist layer 142.

Figure 1F:
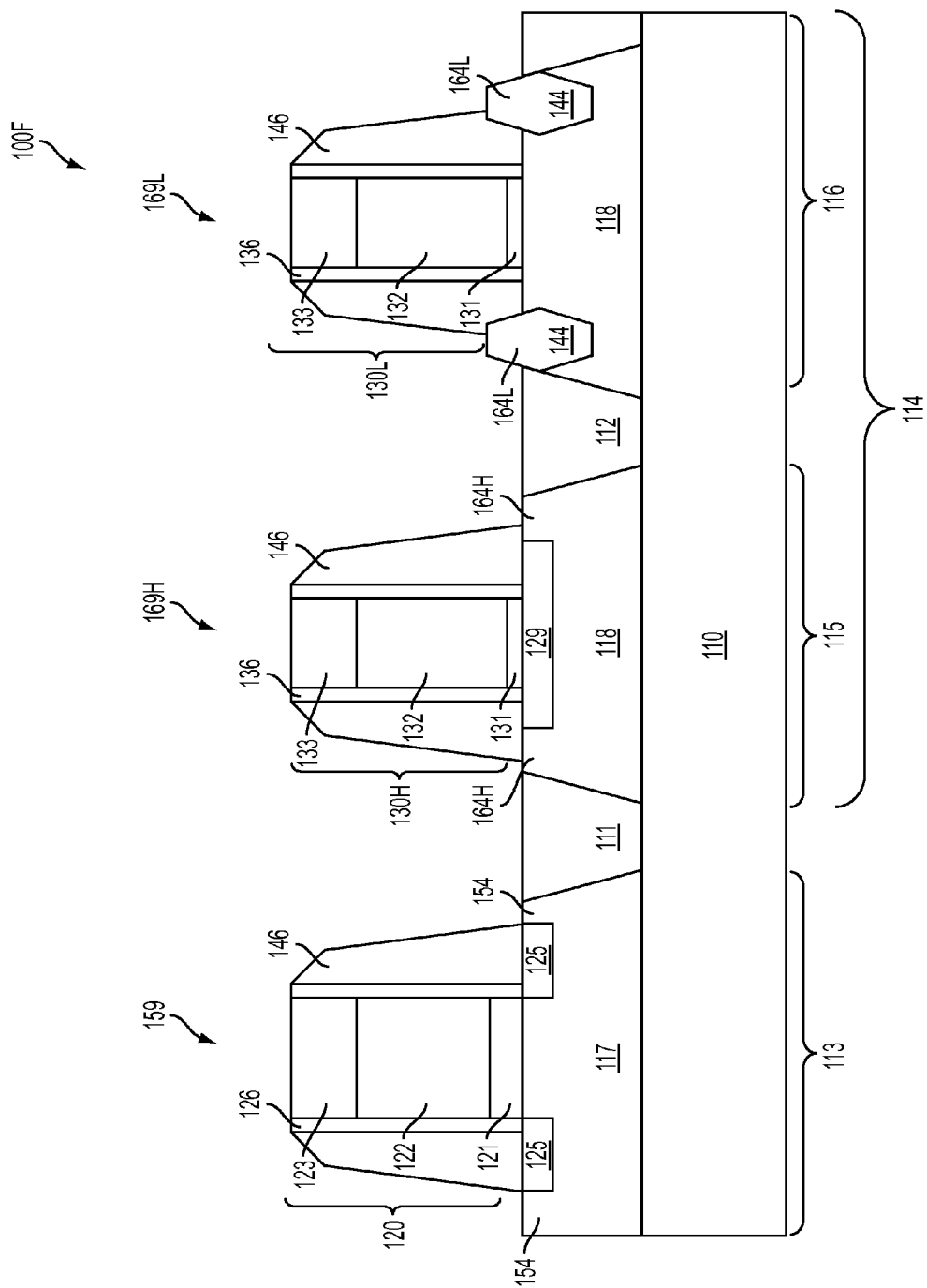

In the operation in FIG. 1F, main spacers 146 are formed over the dummy spacers 126, 136. For example, the spacers 146 are formed by blanket depositing a dielectric layer over the structure 100E, and then anisotropically etching to remove the dielectric layer to form the spacers 146. The spacers 146 comprise a dielectric material, such as silicon nitride, silicon oxide, silicon oxynitride, other suitable materials, or combinations thereof. In at least one embodiment, the dummy spacers 126 and/or 136 are removed before the formation of the main spacers 146. For example, the dummy spacers 126 and/or 136 are removed by a wet etching using phosphoric acid or hydrofluoric acid, or by a dry etching using a suitable etchant.

The source and drain regions 154, 164H and 164L are formed in the corresponding I/O device region 113, HVt device region 115 and LVt device region 116. For example, the source and drain regions 154 and 164H are formed by doping the substrate 110 outside the corresponding gate structure 120 and gate structure 130H, and the source and drain regions 164L are formed by doping the stressors 144 outside the corresponding gate structure 130L with dopants in an ion implantation process, a plasma immersion ion implantation (PIII) process, a gas and/or solid source diffusion process, other suitable process, or combinations thereof. A resulting semiconductor device 100F comprises an I/O device 159, a HVt device 169H and a LVt device 169L. The I/O device 159 comprises the gate structure 120, the corresponding main spacers 146 over the sidewalls of the gate structure 120, and the source and drain regions 154 all formed over the active region 117 in the I/O device region 113. The HVt device 169H comprises the gate structure 130H, the corresponding main spacers 146 over the sidewalls of the gate structure 130H, and the source and drain regions 164H all formed over the active region 118 in the HVt device region 115 of the core device region 114. The LVt device 169L comprises the gate structure 130L, the corresponding main spacers 146 over the sidewalls of the gate structure 130L, and the source and drain regions 164L with stressors 144, all formed over the active region 118 in the LVt device region 116 of the core device region 114.

In some embodiments, the semiconductor device 100F further includes silicide features formed on the source and drain regions 154, 164H and/or 164L to reduce electrical resistance with the contact. The silicide features are formed, for example, by depositing a metal layer, annealing the metal layer such that the metal layer reacts with silicon to form silicide, and then removing the non-reacted metal layer. In some embodiments, the semiconductor device 100F further includes an inter-level dielectric (ILD) layer formed over the substrate 110, and a chemical mechanical polishing (CMP) process is further applied to planarize the ILD layer. In some embodiments, the gate electrodes 122 and/or 132 remain polysilicon in a gate first process. In some embodiments, the polysilicon is removed and replaced with a metal in a gate last or gate replacement process. In a gate last process, the CMP process on the ILD layer is continued to expose the polysilicon of the gate structures 120 and/or 130H and/or 130L, and an etching process is performed to remove the polysilicon, thereby forming trenches. The trenches are filled with a proper work function metal (e.g., p-type work function metal and n-type work function metal) for corresponding p-type devices and n-type devices, respectively. In some embodiments, a multilayer interconnection (MLI) including metal layers and inter-metal dielectric (IMD) is formed over the semiconductor device 100F to electrically connect various features or structures of the semiconductor device 100F. The multilayer interconnection includes vertical interconnects, such as vias or contacts, and horizontal interconnects, such as metal lines. The various interconnection features may implement various conductive materials including copper, tungsten, silicide, and/or some metal alloys. In at least one example, a damascene process is used to form a copper multilayer interconnection structure and one or more metal alloys are deposited as a barrier for such a multilayer structure in the damascene process.

In the description herein, some embodiments include I/O devices and core devices. Such an arrangement is an example. Other arrangements are within the scope of various embodiments. For example, at least one embodiment, I/O devices and the corresponding I/O region are omitted. For another example, in at least one embodiment, the HVt device 169H and the LVt device 169L are not core devices.

In the semiconductor device 100F in accordance with some embodiments, the HVt device 169H has a higher threshold voltage than the LVt device 169L, and the LVt device 169L includes stressors 144 which are not formed in the HVt device 169H. As a result, carrier mobility is higher in the LVt device 169L than in the HVt device 169H due to the presence of the stressors 144, whereas leakage current, which is associated with carrier mobility, is lower in the HVt device 169H due to the absence of stressors. Such an arrangement in at least one embodiment permits flexibility in circuit design with enhanced performance obtained at some devices, e.g., the LVt devices, and current leakage reduction provided at other devices, e.g., the HVt devices. Examples of applications where such an arrangement is advantageous include, but are not limited to, automotive and mobile applications where leakage current is a consideration. In another approach, implantation tuning is employed, but is insufficient to meet low leakage requirements in some applications. In a further approach, the gate length is increased to lower current leakage at the expense of increased die area. Compared to the other approaches, semiconductor devices in accordance with one or more embodiments have leakage current reduced to a level sufficient to meet low leakage requirements in some applications, without increasing the device size and/or chip area.

Figure 2:
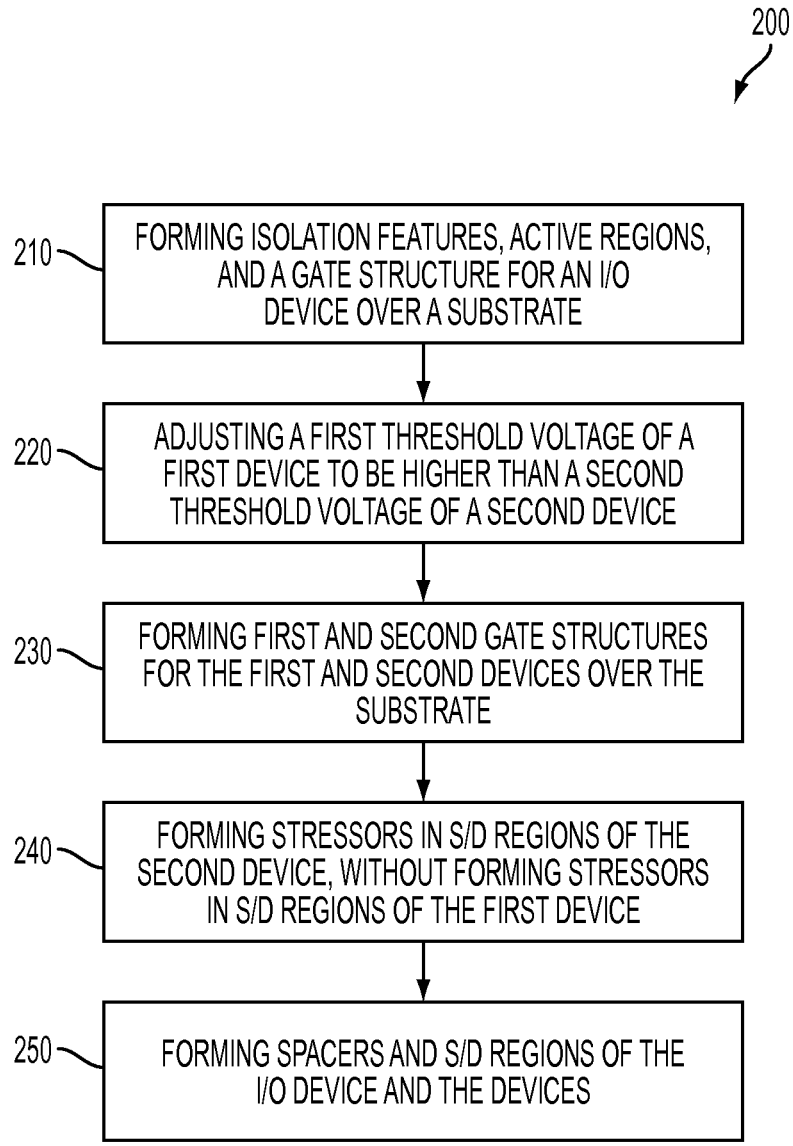
FIG. 2 is a flow chart of a method of manufacturing a semiconductor device in accordance with some embodiments.

FIG. 2 is a flow chart of a method 200 of manufacturing a semiconductor device in accordance with some embodiments.

At an operation 210, isolation features, active regions, and a gate structure for an I/O device are formed over a semiconductor substrate. For example, isolation features 111, 112, active regions 117, 118, and a gate structure 120 for an I/O device are formed over a semiconductor substrate 110, as described with respect to FIG. 1A.

At an operation 220, a first threshold voltage of a first core device is adjusted to be higher than a second threshold voltage of a second core device. For example, the threshold voltage of a first core device to be formed over the active region 118 in the HVt device region 115 is adjusted to be higher than the threshold voltage of a second core device to be formed over the active region 118 in LVt device region 116. An example threshold voltage adjustment includes ion implantation, as described with respect to FIG. 1B.

At an operation 230, first and second gate structures for the first and second core devices are formed over the semiconductor substrate. For example, gate structures 130H and 130L for the corresponding HVt device and LVt device are formed over the substrate 110 in the corresponding active regions 118, as described with respect to FIG. 1C.

At an operation 240, stressors are formed in source and drain regions of the second core device, without forming stressors in source and drain regions of the first core device. For example, stressors 144 are formed in source and drain regions of the LVt device, without forming stressors in source and drain regions of the HVt device, as described with respect to FIGS. 1D-1E.

At an operation 250, spacers and source and drain regions of the I/O device and the core devices are formed. For example, spacers 146 and source and drain regions 154, 164H and 164L of the corresponding I/O device 159, HVt device 169H and LVt device 169L are formed, as described with respect to FIG. 1F.

The method described herein in accordance with some embodiments is useful for manufacturing semiconductor devices using technology nodes at 40 nm and below. The method described herein in accordance with some embodiments is also useful for manufacturing semiconductor devices using technology nodes above 40 nm.

The described method shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

Figure 3:
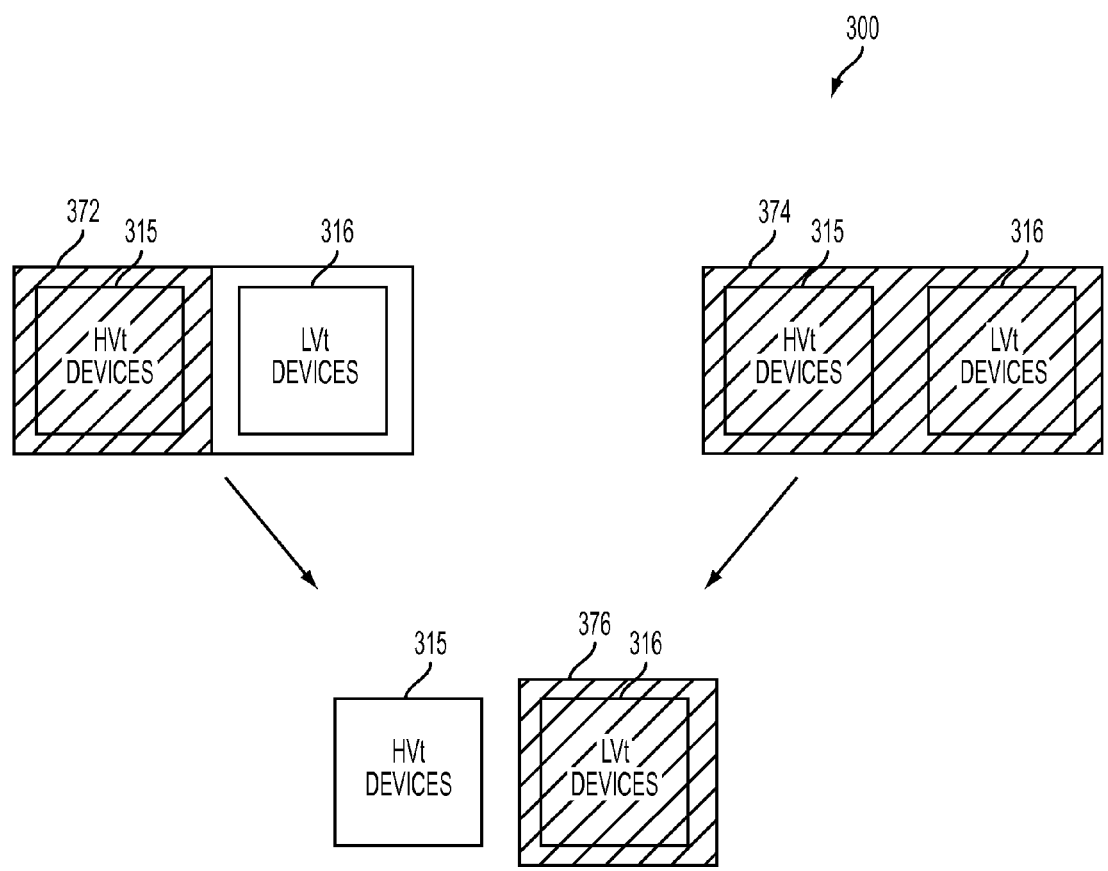
FIG. 3 is a diagram showing a mask generation operation in a method of manufacturing a semiconductor device in accordance with some embodiments.

FIG. 3 is a diagram showing a mask generation operation 300 in a method of manufacturing a semiconductor device in accordance with some embodiments. The mask generation operation 300 is arranged to generate a mask for selectively forming stressors in some devices, e.g., LVt devices in the LVt device region 116, but not in other devices, e.g., the HVt devices in the HVt device region 115.

As shown in FIG. 3, a layout of the semiconductor device to be manufactured includes a HVt device region 315 for HVt devices, and a LVt device region 316 for LVt devices. In at least one embodiment, the HVt device region 315 and LVt device region 316 correspond to the HVt device region 115 and LVt device region 116 as described herein.

A mask 372 is used for an ion implantation to adjust a threshold voltage of the HVt devices to be higher than a threshold voltage of the LVt devices. For example, the mask 372 covers the HVt device region 315 and permits a patterned photoresist layer to be formed over the LVt device region 316 in a photolithography process using the mask 372. As a result, the patterned photoresist layer covers the LVt device region 316, without covering the HVt device region 315, and permits an ion implantation to be performed in the HVt device region 315, but not in the LVt device region 316, for example, as described herein with respect to FIG. 1B.

A mask 374 is to be used in accordance with another approach to form stressors in both the HVt devices and the LVt devices. For example, the mask 374 covers the HVt device region 315 and the LVt device region 316. The mask 374 permits a patterned photoresist layer formed in a photolithography process using the mask 374 to expose both the HVt device region 315 and the LVt device region 316. As a result, the patterned photoresist layer permits stressors to be formed for both HVt devices and LVt devices in accordance with the another approach.

A mask 376 is obtained by performing at least one logic operation (LOP) on the mask 372 and the mask 374. For example, an XOR operation is performed on the mask 372 and the mask 374 to obtain the mask 376. Other LOPs, such as, AND, OR, NOT, NOR, NAND and bias (sizing) are within the scope of various embodiments. In at least one embodiment, more than one LOPs are performed to generate the mask 376. The mask 376 covers the LVt device region 316 and permits a patterned photoresist layer, such as the photoresist layer 142 described with respect to FIG. 1D, to be formed over the HVt device region 315 in a photolithography process using the mask 376. As a result, the patterned photoresist layer covers the HVt device region 315, without covering the LVt device region 316, and permits a stressor formation, such as an epitaxial growth described herein with respect to FIG. 1E, to be performed in the LVt device region 316 but not in the HVt device region 315.

In at least one embodiment, the mask generation operation 300 is a simple modification to change a manufacturing process in accordance with another approach which forms stressors in all core devices to a manufacturing process in accordance with some embodiments which selectively form stressors in LVt devices, but not in HVt devices. As a result, one or more of the various advantages described herein with respect to some embodiments are obtainable with minimal changes to the manufacturing process of another approach. In some embodiments, the mask generation operation 300 is performed by one or more processors and/or application specific integrated circuits (ASICs).

As described herein, some embodiments form stressors in devices with lower threshold voltages, but not in devices with higher threshold voltages. As a result, enhanced carrier mobility and device performance are obtainable for the devices with lower threshold voltages. In the devices with higher threshold voltages, leakage current is reduced which is preferred in some applications, such as automotive and mobile applications. In at least one embodiment, reduced leakage current is obtainable in accordance with some embodiments by adding a simple LOP to a manufacturing process in accordance with another approach.

In some embodiments, a semiconductor device comprises a semiconductor substrate, and a first transistor and a second transistor over the semiconductor substrate. Both the first and second transistors are p-type transistors or both the first and second transistors are n-type transistors. The first and second transistors have the same nominal operating voltage. The first transistor has a higher threshold voltage than the second transistor. The second transistor has at least one of a source region or a drain region with higher charge carrier mobility than at least one of a source region or a drain region of the first transistor.

In some embodiments, a semiconductor device comprises a semiconductor substrate, and a first transistor and a second transistor over the semiconductor substrate. Both the first and second transistors are p-type transistors or both the first and second transistors are n-type transistors. The first and second transistors have corresponding first and second gate dielectric layers, the first and second gate dielectric layers comprising the same dielectric material and having the same thickness. A channel region of the first transistor and a channel region of the second transistor comprise different concentrations of a dopant. A source region and a drain region of the second transistor comprise a stressor, the stressor configured to apply a tensile stress or a compressive stress to the source region and the drain region of the second transistor. A source region and a drain region of the first transistor are free of the stressor.

In a method in accordance with some embodiments, first and second gate structures of corresponding first and second core devices are formed over a semiconductor substrate, and a stressor is formed in source and drain regions of the second core device, but not in source and drain regions of the first core device. Both the first and second core devices are p-type devices or both the first and second core devices are n-type devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate; and
a first transistor and a second transistor over the semiconductor substrate, wherein
both the first and second transistors have a same type of conductivity,
the first and second transistors have a same nominal operating voltage,
the first transistor has a higher threshold voltage than the second transistor,
a source region or a drain region of the second transistor has SiGe or SiC, a channel region of the second transistor and a source region or a drain region of the first transistor are free of SiGe or SiC, and the second transistor has at least one of the source region or the drain region with a higher charge carrier mobility than at least one of the source region or the drain region of the first transistor.

2. The semiconductor device of claim 1, wherein
the at least one of the source region or the drain region of the second transistor comprises a stressor, the stressor configured to cause the higher charge carrier mobility of the at least one of the source region or the drain region of the second transistor, and
the at least one of the source region or the drain region of the first transistor is free of the stressor.

3. The semiconductor device of claim 2, wherein
a channel region of the first transistor and a channel region of the second transistor comprise different concentrations of a dopant, and
the different concentrations of the dopant in the channel regions of the first and second transistors correspond to the higher threshold voltage of the first transistor and a lower threshold voltage of the second transistor.

4. The semiconductor device of claim 2, further comprising:
a third transistor over the semiconductor substrate, wherein
all of the first, second and third transistors are p-type transistors or all of the first, second and third transistors are n-type transistors,
the third transistor has a nominal operating voltage higher than the nominal operating voltage of the first and second transistors, and
a source region and a drain region of the third transistor are free of the stressor.

5. The semiconductor device of claim 4, wherein
the first and second transistors are core devices in a core device region of the semiconductor device, and
the third transistor is an input/output (I/O) device in an I/O region of the semiconductor device.

6. The semiconductor device of claim 1, wherein
the first and second transistors have corresponding first and second gate dielectric layers, and
the first and second gate dielectric layers comprise the same dielectric material and have the same thickness.

7. The semiconductor device of claim 1, wherein
both the first and second transistors are p-type transistors,
the drain region and the source region of the second transistor comprise a stressor configured to apply a compressive stress to the drain region and the source region of the second transistor to enhance hole mobility in the drain region and the source region of the second transistor, and
the drain region and the source region of the first transistor are free of the stressor.

8. The semiconductor device of claim 1, wherein
both the first and second transistors are n-type transistors,
the drain region and the source region of the second transistor comprise a stressor configured to apply a tensile stress to the drain region and the source region of the second transistor to enhance electron mobility in the drain region and the source region of the second transistor, and
the drain region and the source region of the first transistor are free of the stressor.

9. The semiconductor device of claim 1, wherein
the first and second transistors have corresponding first and second gate dielectric layers, the first and second gate dielectric layers comprising the same dielectric material and having the same thickness,
a channel region of the first transistor and a channel region of the second transistor comprise different concentrations of a dopant, wherein
the source region and the drain region of the second transistor comprise a stressor, the stressor configured to apply a tensile stress or a compressive stress to the source region and the drain region of the second transistor so that the second transistor has the higher charge carrier mobility than the first transistor, and
the source region and the drain region of the first transistor are free of the stressor.

10. The semiconductor device of claim 9, wherein
the first and second transistors are p-channel metal-oxide semiconductor (PMOS) transistors, and
the stressor comprises SiGe.

11. The semiconductor device of claim 9, wherein
the first and second transistors are n-channel metal-oxide semiconductor (NMOS) transistors, and
the stressor comprises SiC.

12. The semiconductor device of claim 9, wherein the source region and the drain region of the second transistor are raised above the source region and the drain region of the first transistor.

13. The semiconductor device of claim 9, further comprising:
a third transistor over the semiconductor substrate, wherein
all of the first, second and third transistors are p-type transistors or all of the first, second and third transistors are n-type transistors,
the third transistor has a gate dielectric layer thicker than the first and second gate dielectric layers, and
a source region and a drain region of the third transistor are free of the stressor.

14. The semiconductor device of claim 13, wherein
the first and second transistors are core devices in a core device region of the semiconductor device, and
the third transistor is an input/output (I/O) device in an I/O region of the semiconductor device, the third transistor configured to input and output date to and from circuitry in the core region, the circuitry comprising at least one of the first transistor or the second transistor.

15. The semiconductor device of claim 1, wherein
both the first transistor and second transistor are core devices,
a channel region of the first transistor comprises a region having a dopant region configured to reduce a number of charge carriers in an active region of the first transistor,
the source region and the drain region of the second transistor comprise a stressor, and
the source region and the drain region of the first transistor are free of the stressor.

16. The semiconductor device of claim 15, wherein a first gate dielectric layer of the first transistor has a same thickness as a second gate dielectric layer of the second transistor.

17. The semiconductor device of claim 15, further comprising:
an input/output (I/O) transistor over the semiconductor substrate, wherein
all of the I/O transistor, the first transistor and the second transistor are p-type transistors or all of the I/O transistor, the first transistor and the second transistor are n-type transistors, and
source and drain regions of the I/O transistor are free of the stressor.

18. The semiconductor device of claim 17, wherein
all of the I/O transistor, the first transistor and the second transistor are p-type transistors, and the stressor comprises SiGe, or
all of the I/O transistor, the first transistor and the second transistor are n-type transistors, and the stressor comprises SiC.

19. A semiconductor device, comprising:
a first transistor over a substrate, a source/drain region of the first transistor having SiGe or SiC; and
a second transistor over the substrate, a source/drain region of the second transistor being free of SiGe or SiC;
wherein the first transistor and the second transistor have a same type of conductivity and a same nominal operating voltage, the second transistor has a higher threshold voltage than the first transistor, a top surface of a channel region of the first transistor is coplanar with a top surface of the substrate, and a top surface of a channel region of the first transistor is co-planar with a top surface of a channel region of the second transistor.

20. A semiconductor device, comprising:
a first core transistor, wherein the first core transistor has a first source/drain region comprising SiGe or SiC, a top surface of the first source/drain region is above a top surface of a channel region of the first core transistor, and the first core transistor has a dopant under a gate dielectric layer; and
a second core transistor, wherein the second core transistor has a same type of conductivity as the first transistor,
wherein the second core transistor has a higher threshold voltage than the first core transistor, and the second core transistor has a second source/drain region being free of SiGe or SiC, and a conductivity type of a dopant in the first source/drain region is different from a conductivity type of the dopant under the gate dielectric layer.

* * * * *